(12) United States Patent
Wehlus et al.

(10) Patent No.: US 10,217,940 B2
(45) Date of Patent: Feb. 26, 2019

(54) OPTOELECTRONIC DEVICE

(71) Applicant: OSRAM OLED GmbH, Regensburg (DE)

(72) Inventors: Thomas Wehlus, Lappersdorf (DE); Daniel Riedel, Regensburg (DE); Nina Riegel, Tegernheim (DE); Silke Scharner, Regensburg (DE); Johannes Rosenberger, Regensburg (DE); Arne Fleissner, Regensburg (DE)

(73) Assignee: OSRAM OLED GMBH, Regensburg (DE)

( * ) Notice: Subject to any disclaimer, the term of this patent is extended or adjusted under 35 U.S.C. 154(b) by 0 days.

(21) Appl. No.: 15/507,221

(22) PCT Filed: Aug. 12, 2015

(86) PCT No.: PCT/EP2015/068543
§ 371 (c)(1),
(2) Date: Feb. 27, 2017

(87) PCT Pub. No.: WO2016/030184
PCT Pub. Date: Mar. 3, 2016

(65) Prior Publication Data
US 2017/0256715 A1    Sep. 7, 2017

(30) Foreign Application Priority Data
Aug. 26, 2014   (DE) .................. 10 2014 112 204

(51) Int. Cl.
*H01L 29/08*    (2006.01)
*H01L 35/24*    (2006.01)
(Continued)

(52) U.S. Cl.
CPC ........ *H01L 51/0022* (2013.01); *H01L 51/445* (2013.01); *H01L 51/5012* (2013.01);
(Continued)

(58) Field of Classification Search
CPC ............. H01L 51/5012; H01L 51/5203; H01L 51/0022; H01L 51/445
See application file for complete search history.

(56) References Cited

U.S. PATENT DOCUMENTS 8,927,325 B2    1/2015   Gaerditz et al.
9,184,420 B2    11/2015  Krall et al.
(Continued)

FOREIGN PATENT DOCUMENTS

DE    102008045948 A1    3/2010
DE    102012206111 A1    10/2013
(Continued)

OTHER PUBLICATIONS

Machine translation of JP2002083692 cited in the IDS filed Feb. 27, 2017.*

*Primary Examiner* — Jaehwan Oh
*Assistant Examiner* — John M Parker
(74) *Attorney, Agent, or Firm* — Slater Matsil, LLP

(57) ABSTRACT

An optoelectronic device is disclosed. In an embodiment the optoelectronic device includes a light-transmissive first electrode, an electrically conductive track including a metal, and a functional organic region having at least one active region, wherein the electrically conductive track is arranged between the first electrode and the functional organic region and wherein the electrically conductive track is in direct contact with the first electrode and the functional organic region.

7 Claims, 2 Drawing Sheets

(51) Int. Cl.
*H01L 51/00* (2006.01)
*H01L 51/44* (2006.01)
*H01L 51/52* (2006.01)
*H01L 51/50* (2006.01)
*H01L 51/56* (2006.01)

(52) U.S. Cl.
CPC ...... *H01L 51/5206* (2013.01); *H01L 51/5212* (2013.01); *H01L 51/5234* (2013.01); *H01L 51/56* (2013.01); *Y02E 10/549* (2013.01); *Y02P 70/521* (2015.11)

(56) References Cited

U.S. PATENT DOCUMENTS

| | | | |
|---|---|---|---|
| 2011/0186866 A1* | 8/2011 | Farquhar | H01L 25/048 257/88 |
| 2014/0125219 A1* | 5/2014 | Choi | H05B 33/04 313/503 |
| 2015/0207097 A1 | 7/2015 | Reusch et al. | |
| 2015/0270487 A1 | 9/2015 | Wichtendahl et al. | |
| 2018/0138453 A1* | 5/2018 | Burroughes | H01L 51/5032 |

FOREIGN PATENT DOCUMENTS

| | | |
|---|---|---|
| DE | 102012214248 A1 | 2/2014 |
| DE | 102012109777 A1 | 4/2014 |
| JP | 2002083692 A | 3/2002 |
| JP | 2009081104 A | 4/2009 |
| WO | 2008087192 A2 | 7/2008 |
| WO | 2013043197 A1 | 3/2013 |
| WO | 2013137234 A1 | 9/2013 |

\* cited by examiner

OPTOELECTRONIC DEVICE

This patent application is a national phase filing under section 371 of PCT/EP2015/068543, filed Aug. 12, 2015, which claims the priority of German patent application 10 2014 112 204.6, filed Aug. 26, 2014, each of which is incorporated herein by reference in its entirety.

TECHNICAL FIELD

An optoelectronic device is provided.

BACKGROUND

The document WO 2008/087192 A2 describes an optoelectronic device.

SUMMARY OF THE INVENTION

Embodiments provide an optoelectronic device that can be produced particularly cost-effective.

According to at least one embodiment of the optoelectronic device, the optoelectronic device is a light-generating device and/or a light-receiving device. In particular, the light can be electromagnetic radiation from the frequency range from infrared radiation up to ultraviolet radiation. The optoelectronic device can, for example, comprise or be formed by one of the following devices: organic light-emitting diode (OLED), organic photodiode, organic solar cell.

According to at least one embodiment of the optoelectronic device, the optoelectronic device comprises a first electrode, which is of light-transmissive design. The first electrode can be an anode or a cathode of the optoelectronic device. The first electrode is formed, e.g., as a thin metal layer or as a layer composed of a transparent conductive oxide (TCO) such as ITO or ZnO. "Light-transmissive" here and below means that at least 50%, preferably at least 75%, of the light generated or to be detected by the optoelectronic device during operation passes through the light-transmissive component, e.g., the first electrode.

The first electrode is in particular of planar design. In other words, the first electrode has a main extension plane and a thickness measured perpendicular to the main extension plane, the thickness being small compared with a length or width of a cover surface of the first electrode which, within the limits of manufacturing tolerance, runs parallel to the main extension plane of the first electrode. In other words, the first electrode is in the form of a planar layer.

According to at least one embodiment of the optoelectronic device, the optoelectronic device comprises an electrically conductive track, which comprises a metal. The electrically conductive track in this case can contain or consist of at least one metal. The electrically conductive track preferably has, in at least one spatial direction, an electric conductance which is greater than the electric conductance of the first electrode in the same spatial direction. The electric conductance of the electrically conductive track can be greater in all spatial directions than the electric conductance of the first electrode in the same spatial directions. Particularly in a direction parallel to the main extension plane of the first electrode, the electrically conductive track has a greater electric conductance than the first electrode in this direction.

The electrically conductive track is formed, e.g., along a line, in particular along a straight line, and has a length that corresponds to at least 80%, in particular at least 90%, of the width and/or length of the cover surface of the first electrode. For example, the electrically conductive track extends in particular along a straight line from one end of the first electrode to an opposite end of the first electrode. It is also possible here for the electrically conductive track to project beyond the electrode at least at one end and therefore, e.g., to be longer than the first electrode is long or longer than the first electrode is wide. Here, the optoelectronic device can comprise two or more electrically conductive tracks, in particular of the same configuration, which are arranged at a distance from one another on the first electrode.

According to at least one embodiment of the optoelectronic device, the optoelectronic device comprises a functional organic region, which comprises at least one active region. During operation of the optoelectronic device, light is generated and/or absorbed in the at least one active region. The at least one active region can therefore be in particular a light-generating region. In this case, the active region can contain, e.g., fluorescent and/or phosphorescent emitter materials. Furthermore, the functional organic region can comprise organic, electron-transporting and/or organic, hole-transporting materials, which can at least partially surround the active region.

According to at least one embodiment of the optoelectronic device, the electrically conductive track is arranged between the first electrode and the functional organic region and is in direct contact with the first electrode and the functional organic region. This means, the electrically conductive track runs, e.g., on a cover surface of the first electrode facing the functional organic region and is positioned with its lower side facing the first electrode in direct contact with the first electrode. The functional organic region then directly adjoins the electrically conductive track on an upper side facing away from the lower side of the electrically conductive track.

Furthermore, in positions where the first electrode is not covered by the electrically conductive track, the functional organic region can directly adjoin the first electrode. In addition, it is possible for lateral surfaces of the electrically conductive track, which run transverse or perpendicular to a base surface on the lower side of the electrically conductive track and/or a cover surface on the upper side of the electrically conductive track, also to be partially or completely surrounded by the material of the functional organic region and directly to adjoin the functional organic region there. Overall, therefore, the electrically conductive track is covered by the first electrode and the functional organic region over a large part of its exterior surface, i.e., over at least 50% of its exterior surface, preferably over at least 75% or over at least 95% of its exterior surface, and is in direct contact there with the aforementioned components of the optoelectronic device.

According to at least one embodiment of the optoelectronic device, the optoelectronic device comprises a first electrode, which is of light-transmissive design, an electrically conductive track, which comprises a metal, and a functional organic region, which comprises at least one light-generating region, wherein the electrically conductive track is arranged between the first electrode and the functional organic region and the electrically conductive track is in direct contact with the first electrode and the functional organic region.

In the optoelectronic device described here, it is therefore in particular possible that no further material, for example, a poorly electrically conductive or an electrically insulating material, is arranged in the form of a layer between the electrically conductive track and the functional organic region. The optoelectronic device is thus free from an additional electrically insulating material between the electrically conductive track and the functional organic region. In other words, the electrically conductive track is not covered by a layer of insulating material on its exterior surface facing the functional organic region. Because such an electrically insulating material is omitted, the optoelectronic device can be produced with reduced effort and therefore particularly inexpensively.

Moreover, in an optoelectronic device as described here, the electrically conductive track is arranged between the first electrode and the functional organic region, as a result of which the electrically conductive track is particularly well protected from negative external influences. The electrically conductive track is also particularly well protected from mechanical damage for this reason, so that it is also possible to use an electrically conductive track which, because of the manufacturing method and/or material used, is particularly mechanically and/or chemically sensitive.

According to at least one embodiment of the optoelectronic device, the electrically conductive track is a printed structure. This means, the electrically conductive track is produced by a printing process, for example, an inkjet printing or screen printing method. The feature according to which the electrically conductive track is a printed structure is also, in particular, a subject feature which can be detected on the finished product, i.e., the optoelectronic device.

Using conventional methods of investigation from semiconductor technology, for example, using microscopic methods, it can be clearly determined that the electrically conductive track is a printed structure. For example, the electrically conductive track is formed by electrically conductive particles which are in direct contact with one another and can be recognized in a microscopic image. Furthermore, a printed structure has a characteristic surface roughness, enabling it to be distinguished clearly from, e.g., electrically conductive tracks structured by photographic technology or from electrically conductive tracks applied through a mask by vapor deposition.

It is advantageously possible to create an electrically conductive track as described here not by structuring a metallized layer initially applied over the entire surface of the first electrode, but the electrically conductive track can be printed directly on to the first electrode without the need for subsequent structuring, for example, by means of an etching process and/or the application of electrically insulating material onto the electrically conductive track. The electrically conductive track of an optoelectronic device as described here can therefore be produced without restructuring a metal layer. In addition, the printing process makes it possible to form a sufficiently thick electrically conductive track, unlike, e.g., an electrically conductive track produced by vapor deposition.

According to at least one embodiment of the optoelectronic device, the functional organic region directly adjoins the first electrode in places and, during operation of the optoelectronic device, the current density between the functional organic region and the first electrode is greater than between the electrically conductive track and the functional organic region. In other words, a current impression into the functional organic region takes place preferentially and predominantly by means of the first electrode and not by means of the electrically conductive track. In the present case, therefore, very little or no current is injected into the functional organic region via the electrically conductive track, but the electrically conductive track serves to improve the limited electrical conductivity of the first electrode, in particular its transverse conductivity.

Here, the limited electrical conductivity of the first electrode has the effect that a voltage drop occurs along the first electrode in the absence of an electrically conductive track, which entails a reduction in the local operating voltage for the operation of the functional organic region. Thereby, an intensity of the light generated during operation, for example, can vary over the radiation surface of the optoelectronic device. The voltage drop can be counteracted by the electrically conductive tracks (often also known as "bus bars") and a luminance distribution can be evened out.

According to at least one embodiment of the optoelectronic device, a charge carrier injection from the electrically conductive track into the functional organic region is inhibited or prevented. In other words, means are provided which lead to the reduction or prevention of a charge carrier injection from the electrically conductive track into the adjacent material of the functional organic region. The means can be additives, which are mixed into the material with which the electrically conductive track is formed. Furthermore, it is possible for the means to consist of a specific choice of the material, e.g., the metals, with which the electrically conductive track is formed.

The charge carrier injection per unit area, i.e., a charge carrier injection density, in this case is lower at the boundary between electrically conductive track and functional organic region than at the boundary between the first electrode and the functional organic region.

According to at least one embodiment of the optoelectronic device, a work function for the charge carriers from the electrically conductive track is lower than the work function from the first electrode and the first electrode is an anode, or the work function for charge carriers from the electrically conductive track is greater than the work function from the first electrode and the first electrode is a cathode. In other words, depending on whether the first electrode is an anode or a cathode, the work function for charge carriers from the electrically conductive track into the functional organic region is adjusted such that a charge carrier injection from the electrically conductive track is reduced compared with a charge carrier injection from the first electrode.

If the first electrode is an anode, for example, in order to reduce the work function, materials that have a lower work function than the material with which the first electrode is formed are selected to form the electrically conductive track. For example, the electrically conductive track is formed for this purpose by a material selected from the alkali metal compounds. In other words, the electrically conductive track contains or consists of an alkali metal compound. For example, the alkali metal compound LiAg is particularly suitable here.

If, for example, the electrically conductive track is a printed structure generated by inkjet printing, a selection of the metals or alloys employed in the metallic ink can be made such that these have a low work function.

According to at least one embodiment of the optoelectronic device, the electrically conductive track comprises a dopant, wherein the dopant is configured to deactivate another opposite-type dopant present in the adjacent functional organic region. The electrically-conductive track adjoins a p-doped region of the functional organic region. Then, the material with which is formed the electrically-conductive track, the metal ink used for the inkjet printing, is then applied with an n-doped material.

According to one theory of the functioning, the dopants diffuse out of the electrically conductive track into the adjacent functional region where they deactivate the vapor-deposited dopants. In this way, it is possible to inhibit or prevent an injection of charge carriers in the boundary region between the electrically conductive track and the functional organic region. In particular, it is also possible here for a dopant that is used in the functional organic region on the side of the active region opposite to the electrically conductive track to be used as the dopant in the electrically conductive track.

By the use of a dopant in the electrically conductive track it is possible to form zones that are free of charge carriers or reduced in charge carriers in the boundary region between the electrically conductive track and the functional organic region, wherein the electrically conductive track and the functional organic region can form a p-n junction which is in antiparallel connection with the p-n junction on the active region of the organic functional region. This way, it is possible in particular for the bus bars having a dopant to represent diodes in antiparallel connection with the adjacent functional organic region, which can increase the ESD resistance of the optoelectronic device. An optoelectronic device as described herein can therefore also be characterized by increased ESD resistance.

It is possible here to combine the means for reducing the injection of charge carriers from the electrically conductive track into the functional organic region in the form of a choice of the materials for forming the electrically conductive track with the introduction of dopants into the electrically conductive track in order to prevent as completely as possible the injection of charge carriers in the boundary region between electrically conductive track and functional organic region.

According to at least one embodiment of the optoelectronic device, the first electrode is a layer having a main extension plane, wherein the area of the main extension plane is at least 90% of the area of a cross-sectional area of the functional organic region, wherein the cross-sectional area is arranged in parallel to the main extension plane. In other words, the first electrode is a planar layer, which is in contact with the functional organic region over a large area. The first electrode can be formed in particular by a transparent conductive oxide here.

According to at least one embodiment of the optoelectronic device, the optoelectronic device comprises a plurality of electrically conductive tracks. The plurality of electrically conductive tracks are configured and arranged similar to the electrically conductive track that has been described. According to this embodiment of the optoelectronic device, that means that two or more electrically conductive tracks, which comprise a metal, are arranged between the first electrode and the functional organic region.

The electrically conductive tracks can be arranged at a distance from one another along parallel straight lines, for example. For example, the electrically conductive tracks cover at least 1% and at most 20%, in particular at most 10% of the cover surface of the first electrode on which they are arranged. Furthermore, it is possible for the electrically conductive tracks to cross one another in some places and form, e.g., a lattice pattern.

According to at least one embodiment of the optoelectronic device, a second electrode, which is arranged on a side of the functional organic region facing away from the first electrode, is present in the optoelectronic device. In other words, the functional organic region is arranged between the first and second electrodes. The second electrode can be of light-transmissive or light-reflecting design here. Particularly in the event that the second electrode is of light-transmissive design, it is possible for at least one additional electrically conductive track to be arranged between the second electrode and the functional organic region, wherein the additional electrically conductive track is in direct contact with the second electrode and the functional organic region.

This means, in the same way as the electrically conductive tracks are arranged between the first electrode and the functional organic region, at least one additional electrode can be arranged between the functional organic region and the second electrode and be in direct contact with these two components. In this case, all features that are disclosed for the electrically conductive track are also disclosed accordingly for the additional electrically conductive track and are therefore not repeated at this point.

The optoelectronic device described herein will be explained in more detail below by means of exemplary embodiments and the accompanying figures.

BRIEF DESCRIPTION OF THE DRAWINGS

In conjunction with FIGS. 1A, 1B and 1C, method steps for producing an optoelectronic device as described herein are explained in more detail by means of sectional illustrations.

In conjunction with the sectional illustration of FIG. 2, a further exemplary embodiment of an optoelectronic device described herein is explained in more detail.

DETAILED DESCRIPTION OF ILLUSTRATIVE EMBODIMENTS

Figure 1A:
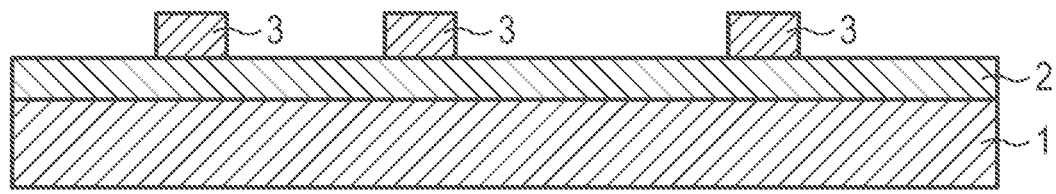

Same, similar or like elements or elements having the same effect are provided with the same reference numerals in the figures. The figures and the size ratios to one another of the elements illustrated in the figures should not be considered as being to scale. Rather, individual elements may be illustrated in an exaggerated size for the purpose of better illustration and/or understanding.

FIG. 1A, shows a first process step for the production of an optoelectronic device as described here using a sectional view. Here, a carrier 1 is initially provided. The carrier 1 is preferably of light-transmissive design and can be formed by a glass substrate, for example.

On a cover surface of the carrier 1, the first electrode 2 is arranged. The first electrode 2 can, for example, be a light-transmissive electrode that consists of a TCO material such as ITO.

Figure 1B:
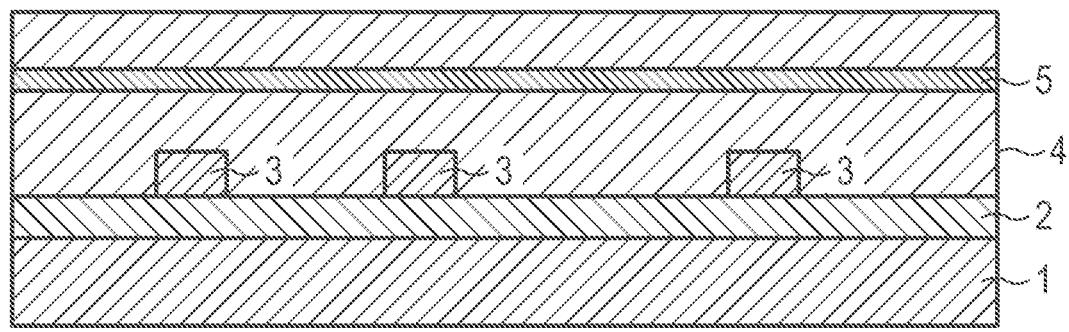

In a further step of the method, electrically conductive tracks 3 are attached onto the cover surface of the first electrode 2 facing away from the carrier 1 by means of a printing process. For example, the electrically conductive tracks 3 are generated by inkjet printing. In this case, the electrically conductive tracks 3 are formed by a metallic ink, which is modified such that no injection or only a reduced injection of charge carrier into the functional organic region 4 takes place, which is attached in the process step shown in conjunction with FIG. 1B. The functional organic region 4 surrounds the printed conductive tracks 3, so that these directly adjoin the first electrode 2 and the functional organic region 4. The functional organic region 4 here comprises at least one active region 5, in which light is generated during operation, for example.

Figure 1C:
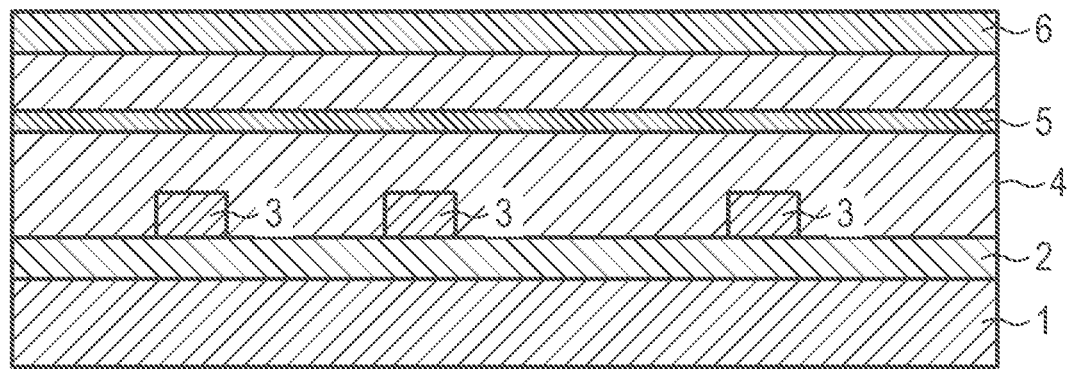

In the next process step, FIG. 1C, a second electrode 6 is attached to the side of the functional organic region facing away from the first electrode 2. The second electrode 6 can, for example, be configured to reflect radiation, so that light enters or exits through the light-transmissive carrier 2.

In further process steps (not illustrated), an encapsulation of the optoelectronic device is effected by applying, e.g., a cover and/or an encapsulating layer sequence in order to hermetically seal the optoelectronic device.

Figure 2:
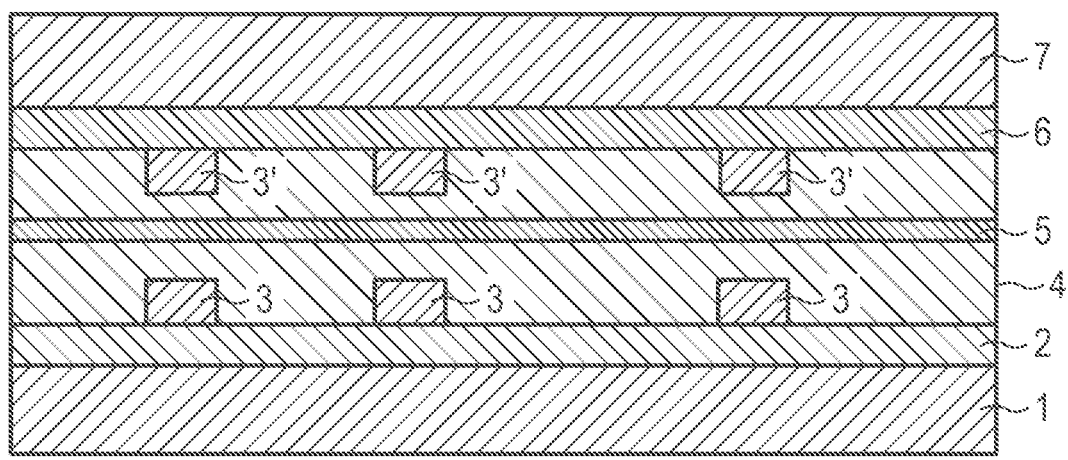

In conjunction with the sectional illustration of FIG. 2, a more detailed explanation is given of an exemplary embodiment of the optoelectronic device, in which light is emitted on both sides and the optoelectronic device itself is of light-transmissive design. In this case, the optoelectronic device can be a so-called transparent OLED, for example.

The optoelectronic device comprises the carrier 1, which is formed, e.g., by glass, a first electrode 2, which is formed by a TCO material, and the electrically conductive tracks 3, which are modified in such a way that a charge carrier injection into the adjacent functional organic region is reduced or prevented.

The functional organic region 4 comprises a light-generating active region 5. On the side of the functional organic region 4 facing away from the first electrode 2, the second electrode 2 is applied, which is also of light-transmissive design and is formed by a TCO material or a thin metal layer. Between the second electrode 6 and the functional organic region 4, additional conductive tracks 3' are arranged, which are also modified such that a charge carrier injection from the conductive tracks 3' into the surrounding organic material of the functional organic region 4 is inhibited or prevented compared with a charge carrier injection from the second electrode 6 into the functional organic region 4.

The device is closed off by a covering 7, which can again be an encapsulation and/or a covering body such as, e.g., a cover glass.

Overall, the optoelectronic devices described herein can be produced particularly cost-effective, since structuring of the electrically conductive tracks already takes place while the tracks are being produced and not subsequently and, because of the reduced charge carrier injections from the electrically conductive tracks into the surrounding organic material of the functional organic region, there is no need for any additional covering, electrically insulating layers on the electrically conductive tracks. Furthermore, the electrically conductive tracks between the electrodes and the organic functional region are particularly well protected from chemical and mechanical influences and the electrically conductive tracks can perform further functional tasks in the optoelectronic device, such as, e.g., increasing the ESD resistance of the optoelectronic device.

The invention is not limited to the description by said description by means of the exemplary embodiments. Rather, the invention comprises any new feature and any combination of features, which in particular includes any combination of features in the patent claims, even if this feature or this combination per se is not explicitly stated in the patent claims or exemplary embodiments.

The invention claimed is:

1. A method for producing an optoelectronic device, the method comprising:
   applying a light transmissive first electrode to a carrier;
   printing an electrically conductive track, which comprises a metal, on a side of the first electrode which faces away from the carrier; and
   applying a functional organic region, which comprises at least one active region, on a side of the first electrode and the electrically conductive track which faces away from the carrier,
   wherein the electrically conductive track is in direct contact with the first electrode and the functional organic region;
   wherein the electrically conductive track is formed by a metallic ink;
   wherein the metallic ink comprises a dopant for the functional organic region; and
   wherein the dopant is configured to deactivate another opposite-type dopant present in an adjacent functional organic region such that, in a boundary region between the electrically conductive track and the functional organic region, at least one area that is free from charge carriers or reduced in charge carriers is formed.

2. The method according to claim 1, wherein the functional organic region is applied to directly adjoin the first electrode.

3. The method according to claim 1, wherein the electrically conductive track and the functional organic region form a p-n junction, which is in antiparallel connection with the active region of the organic functional region.

4. The method according to claim 1, wherein the first electrode is formed as a layer having a main extension plane, wherein an area of the main extension plane is at least 90% of an area of a cross-sectional area of the functional organic region, and wherein the cross-sectional area is arranged parallel to the main extension plane.

5. The method according to claim 1, wherein the first electrode comprises a transparent conductive oxide.

6. The method according to claim 1, further comprising forming a plurality of electrically conductive tracks.

7. The method according to claim 1, further comprising forming a second electrode arranged on a side of the functional organic region facing away from the first electrode.

* * * * *